United States Patent
Zhang

(10) Patent No.: US 9,151,667 B1
(45) Date of Patent: Oct. 6, 2015

(54) METHOD AND SYSTEM FOR STABILIZING POWER OF TUNABLE LASER IN WAVELENGTH-TUNING PHASE SHIFT INTERFEROMETER

(71) Applicant: KLA-Tencor Corporation, Milpitas, FL (US)

(72) Inventor: Yi Zhang, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 262 days.

(21) Appl. No.: 13/693,089

(22) Filed: Dec. 4, 2012

(51) Int. Cl.
*G01B 9/02* (2006.01)
*G01J 1/16* (2006.01)

(52) U.S. Cl.
CPC .......................................... *G01J 1/16* (2013.01)

(58) Field of Classification Search
CPC .................................. G01S 17/66; G02B 6/42
USPC ......... 356/450, 491, 492, 495, 511, 512, 503, 356/513, 514, 519
See application file for complete search history.

(56) References Cited

U.S. PATENT DOCUMENTS

| | | | |
|---|---|---|---|
| 6,304,586 B1 | 10/2001 | Pease et al. | |
| 6,847,458 B2 | 1/2005 | Freischlad et al. | |
| 7,656,539 B1 * | 2/2010 | Lee | 356/521 |
| 8,575,528 B1 * | 11/2013 | Barchers | 250/201.9 |
| 8,853,604 B1 * | 10/2014 | Barchers | 250/201.9 |
| 2007/0012884 A1 * | 1/2007 | Fishkin et al. | 250/458.1 |
| 2010/0208272 A1 | 8/2010 | Tang et al. | |

OTHER PUBLICATIONS

R. Onodera and Y. Ishii, Phase-extraction analysis of laser-diode phase-shifting interferometry that is insensitive to changes in laser power, J. Opt. Soc. Am. A, vol. 13, No. 1, Jan. 1996, pp. 139-146, © Optical Society of America.

* cited by examiner

*Primary Examiner* — Tony Ko
(74) *Attorney, Agent, or Firm* — Suiter Swantz pc llo

(57) ABSTRACT

The present invention includes a laser diode, a laser controller configured to adjust a wavelength of illumination from the laser diode, a beam sampler configured to receive illumination from the laser diode and configured to direct a delivery portion of illumination to a phase-shifting interferometer, the beam sampler configured to direct a reference portion of illumination along a reference path, a detector configured to receive the reference portion of illumination, an amplitude controller configured to receive information associated with optical power of the reference portion of illumination from the detector and further configured to compare optical power of the reference portion of illumination with a selected optical power, and an optical amplitude modulator configured to adjust optical power of illumination received from a first portion of the illumination path, the optical amplitude modulator configured to transmit illumination having adjusted optical power along a second portion of the illumination path.

35 Claims, 10 Drawing Sheets

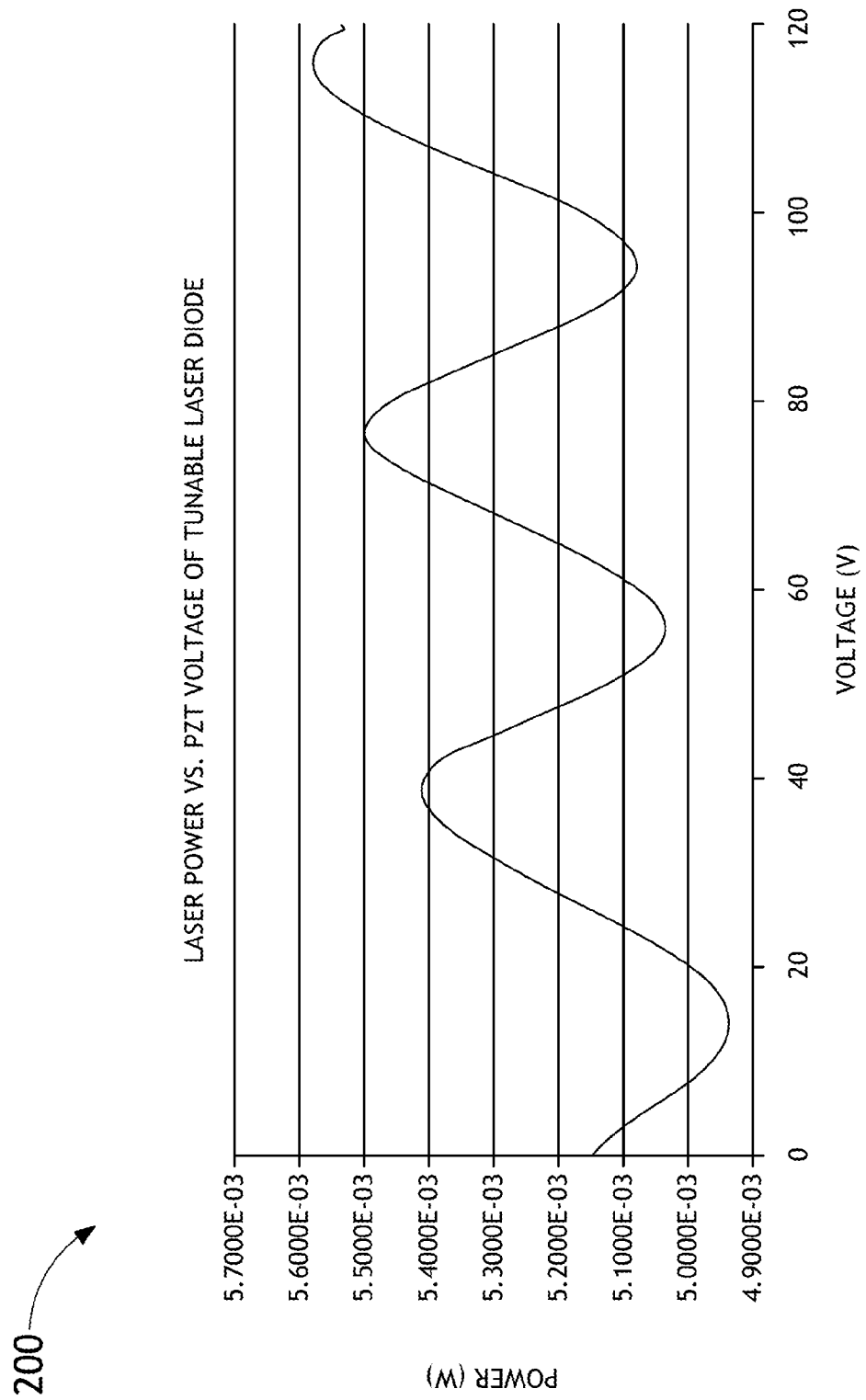

METHOD AND SYSTEM FOR STABILIZING POWER OF TUNABLE LASER IN WAVELENGTH-TUNING PHASE SHIFT INTERFEROMETER

TECHNICAL FIELD

The present invention relates to the field of interferometry, and in particular to system and method for stabilizing optical power of illumination provided by a wavelength-tunable laser for a phase-shifting interferometry system.

BACKGROUND

Interferometry is a useful technique for measuring one or more spatial characteristics of a sample, such as a semiconductor wafer or any other semiconductor or non-semiconductor substrate, utilizing information associated with illumination reflected from test surfaces of a sample. As semiconductor fabrication continually requires higher levels of accuracy and precision, improved interferometry techniques are needed to meet the demands of modern fabrication technologies. Phase-shifting interferometry offers many advantages over other interferometry techniques including, but not limited to, higher measurement accuracy, insensitivity to contrast, illumination uniformity, and obtainable phase at fixed grid points.

In phase-shifting interferometry, a time-varying phase shift is applied to illumination between reference surfaces in a phase-shifting interferometry system and test surfaces of a sample. Reflected illumination is then analyzed to determine intensity of the recorded phases. Information associated with spatial characteristics of the sample can be derived accordingly. One method of applying a time-varying phase shift is by physically moving the reference surfaces or the sample to provide phase-shifting by changing the spatial relationship between the test and reference surfaces. However, the physical motion often results in vibrations tending to degrade measurement accuracy.

Alternatively, phase-shifting interferometry systems may rely on wavelength-tunable illumination sources to provide time-varying phase shifts by providing illumination at different wavelengths. Several wavelength-tunable illumination sources are tuned to different wavelengths by varying the applied level of voltage. However, varying the applied level of voltage tends to also affect optical power of the supplied illumination.

SUMMARY

The present invention is directed to system and method for stabilizing optical power of illumination provided by a wavelength-tunable illumination source.

In one aspect, the present invention includes a system for stabilizing optical power of illumination provided by a wavelength-tunable laser for a phase-shifting interferometry system, comprising: a laser diode, the laser diode configured to provide illumination along an illumination path; a laser controller communicatively coupled to the laser diode, the laser controller configured to adjust a wavelength of illumination emanating from the laser diode; a beam sampler, the beam sampler configured to receive illumination from the illumination path, the beam sampler further configured to direct a delivery portion of illumination received from the illumination path along a delivery path to a phase-shifting interferometer, the beam sampler further configured to direct a reference portion of illumination received from the illumination path along a reference path; a detector, the detector configured to receive a portion of the reference portion of illumination from the reference path; an amplitude controller communicatively coupled to the detector, the amplitude controller configured to receive information associated with optical power of the reference portion of illumination from the detector, the amplitude controller further configured to compare optical power of the reference portion of illumination and a selected optical power; and an optical amplitude modulator communicatively coupled to the amplitude controller, the optical amplitude modulator disposed along the illumination path, the optical amplitude modulator configured to adjust optical power of illumination received from a first portion of the illumination path utilizing information received from the amplitude controller associated with a comparison of the optical power of the reference portion of illumination and the selected optical power, the optical amplitude modulator further configured to transmit illumination having adjusted optical power along a second portion of the illumination path.

In another aspect, the present invention includes a system for stabilizing optical power of illumination provided by a wavelength-tunable laser for a phase-shifting interferometry system, comprising: a phase-shifting interferometer; a laser diode, the laser diode configured to provide illumination along an illumination path; a laser controller communicatively coupled to the laser diode, the laser controller configured to adjust a wavelength of illumination emanating from the laser diode; a beam sampler, the beam sampler configured to receive illumination from the illumination path, the beam sampler further configured to direct a delivery portion of illumination received from the illumination path along a delivery path to the phase-shifting interferometer, the beam sampler further configured to direct a reference portion of illumination received from the illumination path along a reference path; a detector, the detector configured to receive a portion of the reference portion of illumination from the reference path; an amplitude controller communicatively coupled to the detector, the amplitude controller configured to receive information associated with optical power of the reference portion of illumination from the detector, the amplitude controller further configured to compare optical power of the reference portion of illumination and a selected optical power; and an optical amplitude modulator communicatively coupled to the amplitude controller, the optical amplitude modulator disposed along the illumination path, the optical amplitude modulator configured to adjust optical power of illumination received from a first portion of the illumination path utilizing information received from the amplitude controller associated with a comparison of the optical power of the reference portion of illumination and the selected optical power, the optical amplitude modulator further configured to transmit illumination having adjusted optical power along a second portion of the illumination path.

In another aspect, the present invention includes a system for stabilizing optical power of illumination provided by a wavelength-tunable laser for a phase-shifting interferometry system, comprising: a laser diode, the laser diode configured to provide illumination along an illumination path; a laser controller communicatively coupled to the laser diode, the laser controller configured to adjust a wavelength of illumination emanating from the laser diode; a phase-shifting interferometer, the phase-shifting interferometer configured to receive illumination from the illumination path, the phase-shifting interferometer including a detector, the detector configured to receive a portion of illumination received by the phase-shifting interferometer from the illumination path; an amplitude controller communicatively coupled to the detector, the amplitude controller configured to receive information associated with optical power of the portion of illumination from the detector, the amplitude controller further configured to compare optical power of the portion of illumination received by the detector and a selected optical power; and an optical amplitude modulator communicatively coupled to the amplitude controller, the optical amplitude modulator disposed along the illumination path, the optical amplitude modulator configured to adjust optical power of illumination received from a first portion of the illumination path utilizing information received from the amplitude controller associated with a comparison of the optical power of the portion of illumination received by the detector and a selected optical power, the optical amplitude modulator further configured to transmit illumination having adjusted optical power along a second portion of the illumination path.

In another aspect, the present invention includes a method for stabilizing optical power of illumination provided by a wavelength-tunable laser for a phase-shifting interferometry system, comprising the steps of: providing illumination along an illumination path; controlling a wavelength of illumination provided along the illumination path; directing a delivery portion of illumination from the illumination path along a delivery path to a phase-shifting interferometer; directing a reference portion of illumination from the illumination path along a reference path; detecting a portion of the reference portion of illumination from the reference path; acquiring information associated with optical power of the detected portion of the reference portion of illumination; comparing optical power of the detected portion of the reference portion of illumination and a selected optical power; adjusting optical power of illumination received from a first portion of the illumination path utilizing information associated with a comparison of the optical power of the detected portion of the reference portion of illumination and the selected optical power; and transmitting illumination having adjusted optical power along a second portion of the illumination path.

In another aspect, the present invention includes a method for stabilizing optical power of illumination provided by a wavelength-tunable laser for a phase-shifting interferometry system, comprising the steps of: providing illumination along an illumination path to a phase-shifting interferometer; controlling a wavelength of illumination provided along the illumination path; detecting a portion of illumination received by the phase-shifting interferometer from the illumination path; acquiring information associated with optical power of the detected portion of illumination; comparing optical power of the detected portion of illumination and a selected optical power; adjusting optical power of illumination received from a first portion of the illumination path utilizing information associated with a comparison of the optical power of the detected portion of illumination and the selected optical power; and transmitting illumination having adjusted optical power along a second portion of the illumination path.

BRIEF DESCRIPTION OF THE DRAWINGS

The numerous advantages of the disclosure may be better understood by those skilled in the art by reference to the accompanying figures in which:

FIG. 2B is a graphical representation of the relationship between optical power of illumination and voltage applied to a piezoelectric transducer of a wavelength-tunable laser diode, in accordance with one embodiment of the present invention.

DETAILED DESCRIPTION OF THE INVENTION

Figure 1:
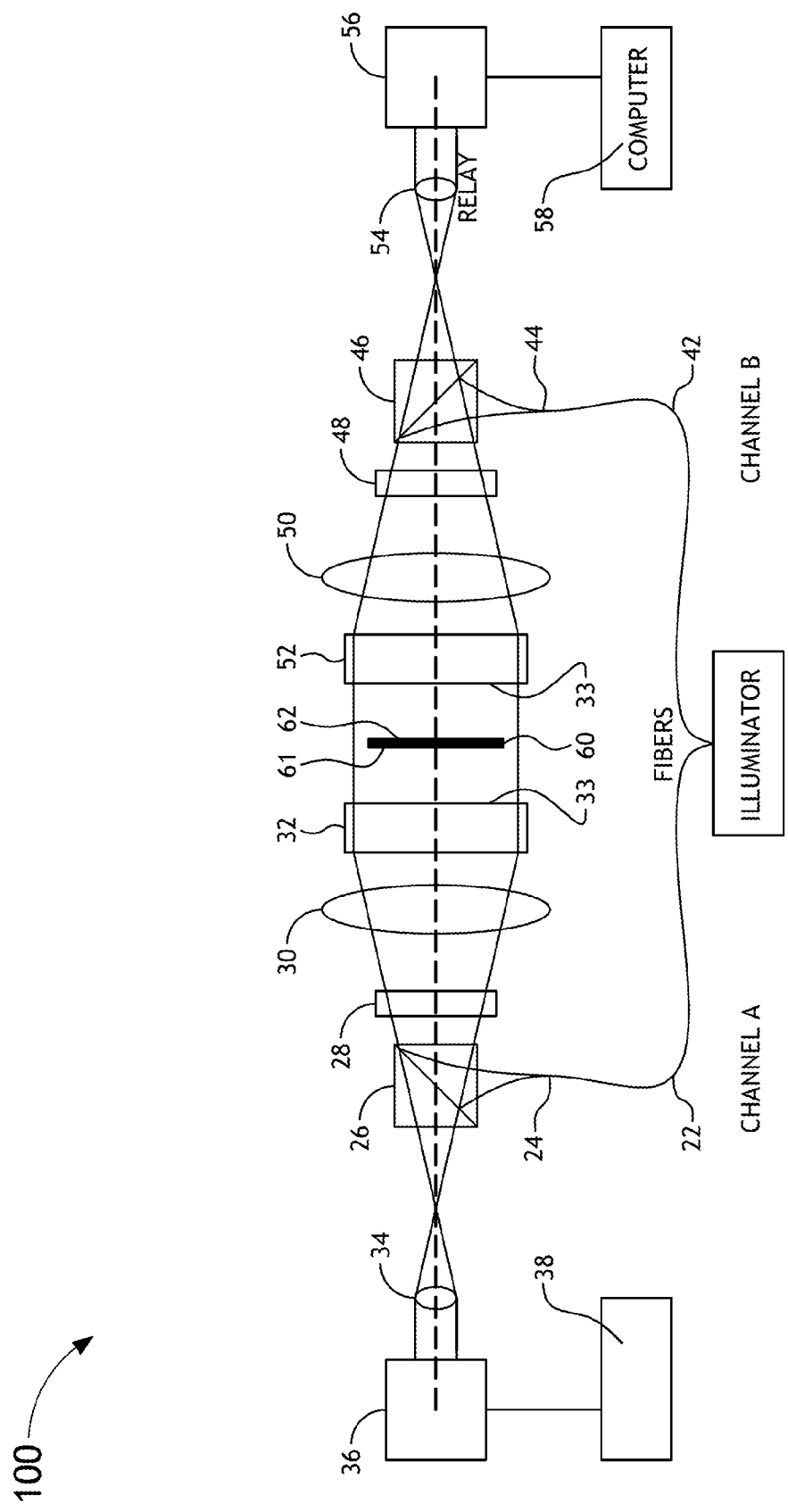
FIG. 1 is a block diagram illustrating a system for providing phase-shifting interferometry to a sample, in accordance with one embodiment of the present invention.

Reference will now be made in detail to the subject matter disclosed, which is illustrated in the accompanying drawings.

FIGS. 1 through 6 generally illustrate a system and method for stabilizing optical power of illumination emanating from one or more illumination sources configured to supply illumination to a phase-shifting interferometer. An illumination source may be configured to provide phase-shifting by providing illumination at a plurality of selectable wavelengths to a phase-shifting interferometer, such as a Fizeau interferometer. Wavelength-tunable illumination sources may be tuned to specific wavelengths by varying voltage supplied to a wavelength-tunable illumination source or to a component, such as a piezoelectric transducer, of the wavelength-tunable illumination source. However, varying the applied voltage level can cause optical power of illumination emanating from the wavelength-tunable illumination source to fluctuate non-linearly. The present invention is directed to improving measurement accuracy in phase-shifting interferometry systems by stabilizing optical power of illumination supplied from one or more wavelength-tunable illumination sources.

As used throughout the present disclosure, the terms "sample" or "wafer" generally refer to any substrate formed of a semiconductor or non-semiconductor material. For example, semiconductor or non-semiconductor materials include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

As used throughout the present disclosure, the terms "illumination path", "delivery path", and "reference path" (collectively "optical paths") generally refer to any path along which illumination can travel, such as free space defining a line of sight between two points. In various embodiments, one or more optical paths may include a path defined by a configuration of one or more optical elements including, but not limited to, optical fibers, couplers, crystals, imaging lenses, glass plates, glass cubes, diffractive elements, retarders, quarter wave plates, focus optics, phase modulators, polarizers, mirrors, beam splitters, reflectors, converging/diverging lenses, prisms, or any other optical elements disclosed herein. The terms "illumination path", "delivery path", and "reference path" are used throughout this disclosure to explain certain elements, features, and/or configurations of the present invention; however, it is noted herein that the terms may be utilized interchangeably to define any optical path. Therefore, the use of one or more of the foregoing terms is not intended to limit the present invention in any way.

FIG. 1 illustrates one embodiment of a system 100 for providing phase-shifting interferometry to at least one sample 160. The system 100 described herein may have a configuration substantially similar to the configurations disclosed in U.S. Pat. No. 6,847,458 and/or U.S. Publication No. 2010/0208272 A1, incorporated herein by reference. It is further noted herein that several systems for providing phase-shifting interferometry are known to the art, and system 100 described herein is included by way of example only. It is contemplated, however, that the present invention may be extended to any phase-shifting interferometry system configured to utilize a wavelength-tunable illumination source for phase shifting. Accordingly, the following description of the system 100 is not intended to limit the present invention in any way.

In one embodiment, the system 100 may be configured to measure one or more spatial characteristics of the sample 160, such as shape, thickness, and/or other spatial parameters of the sample. The system 100 may include one or more phase-shifting interferometers 120 and 140 configured to utilize a wavelength-tunable illumination source for phase shifting. The system 100 may further include an illumination system 110 configured to provide illumination along one or more illumination paths to the one or more phase-shifting interferometers 120 and 140.

The one or more illumination paths of the system 100 may include one or more optical fibers 122 and 142 configured to transmit at least a portion of illumination from the illumination system 110 to one or more illumination outputs 124 and 144. The one or more illumination outputs 124 and 144 may include one or more optical elements connected in series with the one or more optical fibers 122 and 142. Alternatively, the one or more illumination outputs 124 and 144 may be the ends of the one or more optical fibers 122 and 142. The one or more illumination outputs 124 and 144 may be configured to direct at least a portion of illumination to the one or more phase-shifting interferometers 120 and 140.

The one or more phase-shifting interferometers 120 and 140 may include one or more polarizing beam splitters 126 and 146 configured to receive illumination from the one or more illumination outputs 124 and 144. The one or more polarizing beam splitters 126 and 146 may be further configured to direct a portion of illumination to one or more quarter-wave plates 128 and 148 aligned at 45 degrees to the polarization direction of the one or more polarizing beam splitters 126 and 146. Illumination passing through the one or more polarizing beam splitters 126 and 146 and through the one or more quarter-wave plates 128 and 148 may be circularly polarized. The circularly polarized illumination may then be received by one or more lenses 130 and 150 configured to collimate illumination into one or more beams. At least one of the collimated beams may have a diameter greater than a diameter of the sample 160. The one or more lenses 130 and 150 may be further configured to direct the one or more collimated beams to one or more reference flats 132 and 152. The one or more reference flats 132 and 152 may be located parallel to one another. The sample 160 may be disposed in the center of a cavity defined by the one or more reference flats 132 and 152. At least a portion of each of the one or more collimated beams may be transmitted through the one or more reference flats 132 and 152.

A first portion of each of the one or more transmitted beams may be directed to one or more test surfaces 161 and 162 of the sample 160. A second a portion of each of the one or more transmitted beams may be directed to one or more reference surfaces 153 and 133 of the one or more reference flats 152 and 132 located opposite to the one or more transmitting reference flats 132 and 152. For clearer example, the first portion of a transmitted beam from reference flat 132 may be directed to test surface 161 of the sample 160; meanwhile, the second portion of the transmitted beam from reference flat 132 may be directed to reference surface 153 of reference flat 152. Similarly, the first portion of a transmitted beam from reference flat 152 may be directed to test surface 162 of the sample 160; meanwhile, the second portion of the transmitted beam from reference flat 152 may be directed to reference surface 133 of reference flat 132.

The system 100 may further include one or more detectors 136 and 156. The one or more detectors 136 and 156 may include, but are not limited to, one or more CCD detectors, one or more TDI-CCD detectors, one or more CMOS detectors, or any other photodetectors known to the art. The one or more detectors 136 and 156 may be configured to detect portions of illumination reflected from the one or more test surfaces 161 and 162 of the sample 160. The one or more detectors may be further configured to detect portions of illumination reflected from corresponding reference surfaces 133 and 153 of reference flats 132 and 152. The system 100 may further include one or more computing systems 138 and 158 communicatively coupled to the one or more detectors 136 and 156. The one or more computing systems 138 and 158 may be configured to acquire information associated with detected illumination from the one or more detectors 136 and 156. The one or more computing systems 138 and 158 may be further configured to execute a measurement algorithm from program instructions on a carrier medium to determine one or more spatial characteristics of the sample 160 utilizing information associated with detected illumination. Measurement algorithms for determining spatial characteristics of samples with phase-shifting interferometry systems are known to the art. For example, the measurement algorithm may include one or more of the following steps: (i) acquiring information associated with detected portions of illumination from the one or more test surfaces 161 and 162 and detected portions of illumination from corresponding reference surfaces 133 and 153; (ii) determining information associated with test surface heights or phases utilizing acquired information associated with detected portions of illumination; and (iii) determining one or more spatial characteristics of the sample utilizing information associated with test surface heights or phases.

Figure 2A:
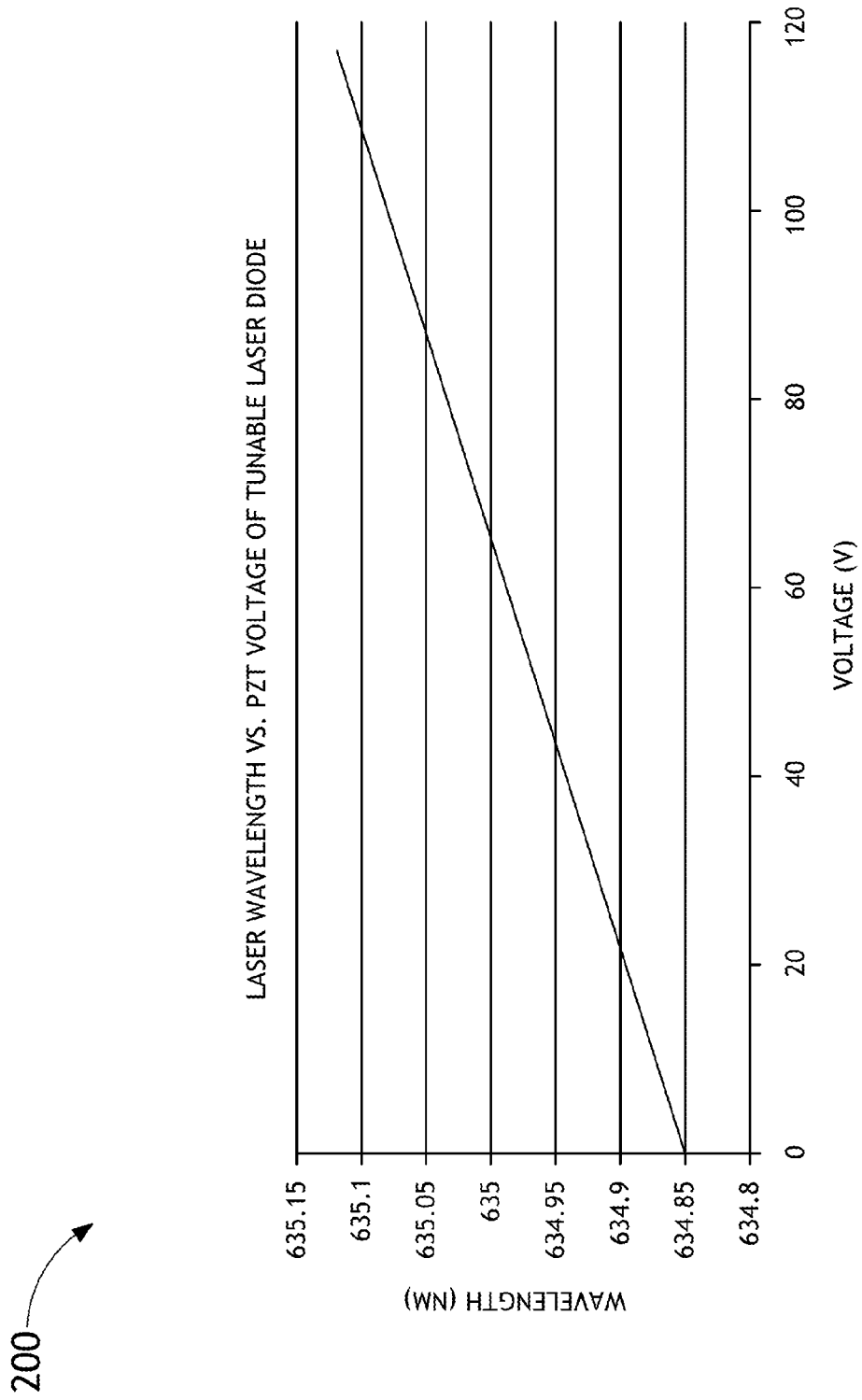
FIG. 2A is a graphical representation of the relationship between wavelength of illumination and voltage applied to a piezoelectric transducer of a wavelength-tunable laser diode, in accordance with one embodiment of the present invention.

Several techniques are known to the art for applying a time-varying phase shift to illumination in between the one or more reference surfaces 133 and 153 and the one or more test surfaces 161 and 162. For example, one method of providing a time-varying phase shift includes physically moving the one or more references flats 132 and 152 or the sample 160 to alter the spatial relationship between the one or more reference surfaces 133 and 153 and the one or more test surfaces 161 and 162. Alternatively, a time-varying phase shift may be provided by changing the wavelength of illumination traveling through the system 100. For example, the illumination system 110 may include a wavelength-tunable laser, such as the TLB7004 from Newport Corporation or any laser configured to provide illumination at a plurality of wavelengths. The wavelength-tunable laser may include an extra-cavity diode laser having a tunable laser diode configured to provide illumination at a plurality of wavelengths in response to variable voltage applied to a piezoelectric transducer of the tunable laser diode. FIG. 2A graphically illustrates the substantially linear relationship between wavelength of illumination as compared to voltage applied to the piezoelectric transducer of the tunable laser diode. In contrast to the linear relationship between applied voltage and illumination wavelength, FIG. 2B graphically illustrates the nonlinear relationship between optical power of illumination as compared to voltage applied to the piezoelectric transducer. As demonstrated by FIG. 2B, the optical power of illumination fluctuates nonlinearly as the applied voltage is increased or decrease. The nonlinear fluctuations can introduce phase error into phase-shifting interferometry measurements. Accordingly, a phase-shifting interferometry system that relies on a wavelength-tunable laser to effect phase-shifting may be susceptible to measurement errors due to nonlinear power fluctuations.

Figure 3A:
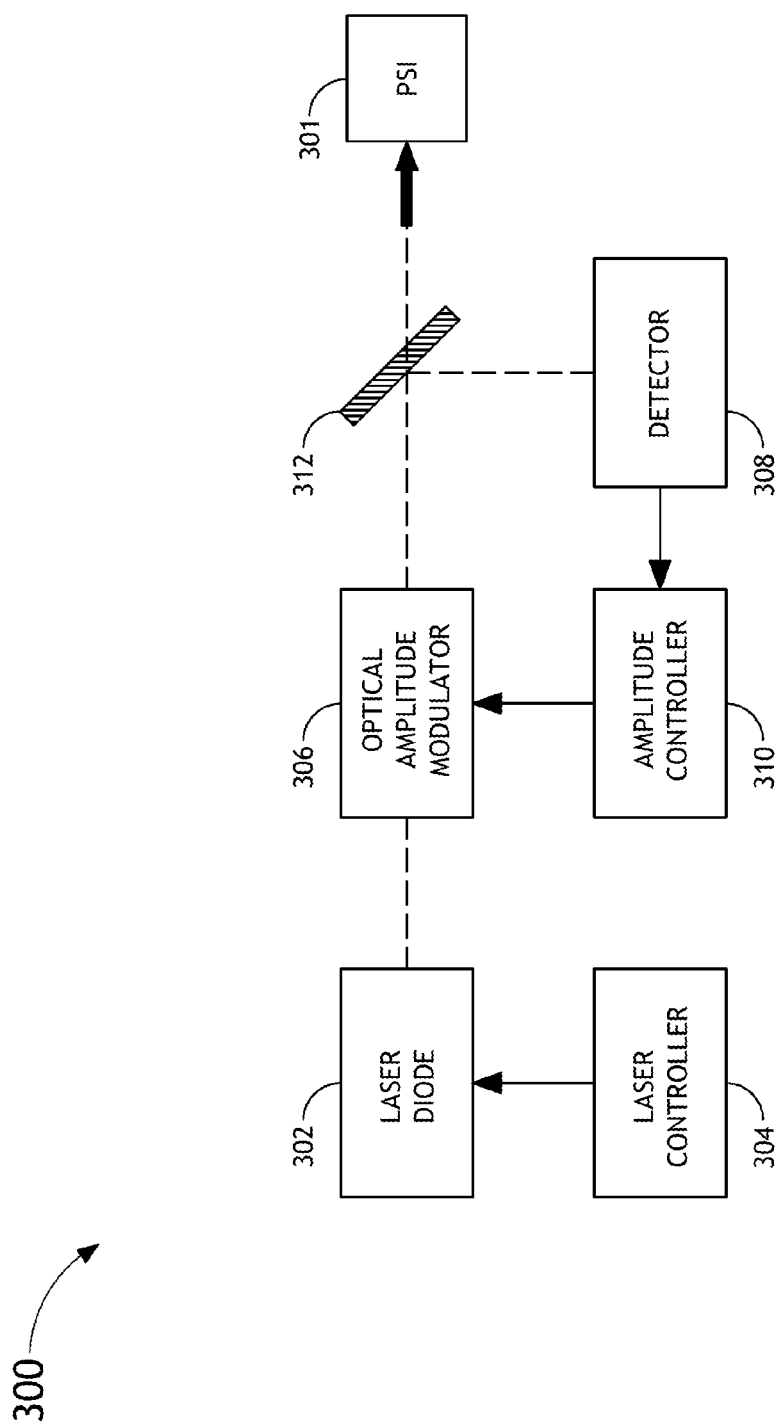
FIG. 3A is a block diagram illustrating a system for stabilizing optical power of illumination provided by a wavelength-tunable laser for a phase-shifting interferometry system, in accordance with one embodiment of the present invention.

FIGS. 3A through 3D generally illustrate a system 300 configured to stabilize optical power of illumination provided by a wavelength-tunable laser for a phase-shifting interferometry system. Referring to FIG. 3A, the system 300 may include a laser diode 302 configured to provide illumination at a plurality of selectable wavelengths along an illumination path. The laser diode 302 may be tunable to a specific wavelength corresponding to an applied voltage. For example, the laser diode 302 may be configured to provide illumination at one or more wavelengths associated with one or more corresponding voltages supplied to a piezoelectric transducer of the laser diode 302.

The system 300 may further include a laser controller 304 communicatively coupled to the laser diode 302. The laser controller 304 may be configured to control the laser diode 302. For example, the laser controller 304 may drive the laser diode 302 by applying voltage to the laser diode 302 or a component (e.g. piezoelectric transducer) of the laser diode 302. The laser controller 304 may be configured to tune the laser diode 302 to a specific wavelength by applying voltage associated with the specific wavelength. Alternatively, the applied voltage may be associated with desired phase-shifting. Accordingly, the laser controller 304 may apply voltage to tune the laser diode 302 to a wavelength associated with the desired phase-shifting.

In one embodiment, the laser controller 304 may include a manually adjustable voltage controller configured to supply variable voltage to the laser diode 302 or a component of the laser diode 302 in response to user control actions. For example, the laser controller 304 may include one or more switches, potentiometers, voltage divider circuits, and/or other discrete electrical or electronics components.

In another embodiment, the laser controller 304 may include one or more computing systems configured to execute a laser control algorithm from program instruction on a carrier medium to control the laser diode 302 in response to user inputs and/or predetermined control instructions. Many laser control algorithms are known to the art. For example, the laser control algorithm may direct the laser controller 304 to apply voltage to tune the laser diode 302 to a user-selected wavelength or to a wavelength corresponding to user-selected phase-shifting. Alternatively, the laser control algorithm may direct the laser controller 304 to tune the laser diode 302 to effect phase-shifting in accordance with programmed instructions to make specified interferometry measurements.

The foregoing examples are illustrative only, and it is further contemplated that the laser controller 304 may be configured to control the laser diode 302 with many alternative configurations of software, hardware, and/or firmware. Accordingly, the forgoing examples are not intended to limit the present invention in any way.

The system 300 may further include a beam sampler 312 configured to receive at least a portion of illumination provided by the laser diode 302 from the illumination path. The beam sampler 312 may be further configured to direct a portion ("delivery portion") of illumination received from the illumination path along a delivery path to a phase-shifting interferometer 301. The beam sampler 312 may be further configured to direct a second portion ("reference portion") of illumination along a reference path. The beam sampler 312 may include a beam splitter, glass plate, glass cube, diffractive element, or any other optical element configured to convert a beam of illumination into two or more beams of illumination.

The system 300 may further include a detector 308 configured to receive at least a portion of the reference portion of illumination from the reference path. The detector 308 may include a CCD camera, CMOS camera, or any other photodetector configured to detect illumination from the reference path.

The system 300 may further include an amplitude controller 310 communicatively coupled to the detector 308. The amplitude controller 310 may be configured to receive information associated with optical power of the reference portion of illumination from the detector 308. The amplitude controller 310 may be further configured to make a comparison of optical power of the reference portion of illumination and a selected optical power. The selected optical power may be any value for optical power of illumination known to the art that is acceptable for making interferometry measurements including, but not limited to, a user selected value, a predetermined value, or a value determined utilizing information associated with one or more components of the illumination system 300 or the phase-shifting interferometer 301.

In one embodiment, the amplitude controller 310 may include one or more computing systems configured to execute a controlled feedback algorithm from program instructions on a carrier medium to compare optical power of the reference portion of illumination and the selected optical power. Controlled feedback algorithms are known to the art. For example, the controlled feedback algorithm may include one or more of the following steps: (i) acquiring information associated with optical power of the reference portion of illumination; (ii) calculating a differential between optical power of the reference portion of illumination and the selected optical power; and (iii) determining a required adjustment to optical power of illumination emanating from the laser diode 302 utilizing information associated with the differential between optical power of the reference portion of illumination and the selected optical power.

In a further embodiment, the amplitude controller 310 may include a proportional integral derivative (PID) controller configured to compare optical power of the reference portion of illumination and the selected optical power. PID controllers are known to the art. As such, the following embodiment of a PID controller is included by way of example only and is not intended to limit the present invention in any way. The PID controller may include one or more computing systems configured to execute one or more steps of the following controlled feedback algorithm: (i) determining information associated with a present or current error measurement between optical power of the reference portion of illumination and the selected optical power; (ii) determining information associated with an accumulation of past error measurements from preceding comparisons of optical power of the reference portion of illumination and the selected optical power; (iii) generating a prediction of future error utilizing information associated with the present error and information associated with the accumulation of past errors; and (iv) determining a required adjustment to optical power of illumination emanating from the laser diode 302 utilizing information associated with the present error, information associated with the accumulation of past errors, and information associated with the predicted value of future error.

The system 300 may further include an optical amplitude modulator 306 communicatively coupled to the amplitude controller 310. The optical amplitude modulator 306 may be configured to stabilize optical power of illumination being delivered to the phase-shifting interferometer 301 by adjusting optical power of illumination being directed along the illumination path. The optical amplitude modulator 306 may be disposed along the illumination path and configured to receive at least a portion of illumination emanating from the laser diode 302 from a first portion of the illumination path. The optical amplitude modulator 306 may be further configured to adjust optical power of the received illumination and to transmit illumination having adjusted optical power along a second portion of the illumination path to the beam sampler 312.

The optical amplitude modulator 306 may be configured to adjust optical power of illumination received from the first portion of the illumination path in response to information received from the amplitude controller 310. For example, the optical amplitude modulator 306 may be configured to adjust optical power of illumination received from the first portion of the illumination path in response to information associated with the comparison of optical power of the reference portion of illumination and the selected optical power. The amplitude controller 310 may be configured to communicate the information in the form of data signals or control signals.

In one embodiment, for example, the amplitude controller 310 may be configured to transmit one or more data signals associated with measurements and/or calculations associated with the comparison of optical power of the reference portion of illumination and the selected optical power to the optical amplitude modulator 306. The optical amplitude modulator 306 may be configured to determine the required adjustment to optical power of illumination received from the first portion of the illumination path utilizing the measurements and/or calculations received from the amplitude controller 310. The optical amplitude modulator 306 may be further configured to make the required adjustment.

In another embodiment, the amplitude controller 310 may be configured determine the required adjustment to stabilize illumination emanating from the laser diode 302, as previously discussed. Accordingly, the amplitude controller 310 may be configured to transmit one or more control signals to the optical amplitude modulator 306 directing the optical amplitude modulator 306 to make the required adjustment to optical power of illumination it receives from the first portion of the illumination path. For example, the one or more control signals may include a set of instructions to be executed by one or more computing systems driving the optical amplitude modulator 306. Alternatively, the one or more control signals may include a voltage signal applied to at least one component of the optical amplitude modulator.

Several types of optical amplitude modulators are known to the art. For example, the optical amplitude modulator 306 may include, but is not limited to, an electro-optical amplitude modulator, a variable optical attenuator, a pockets cell, an acoustic-optical modulator, a variable absorbing material, or any other device known to the art for adjusting optical power of illumination.

Figure 3B:
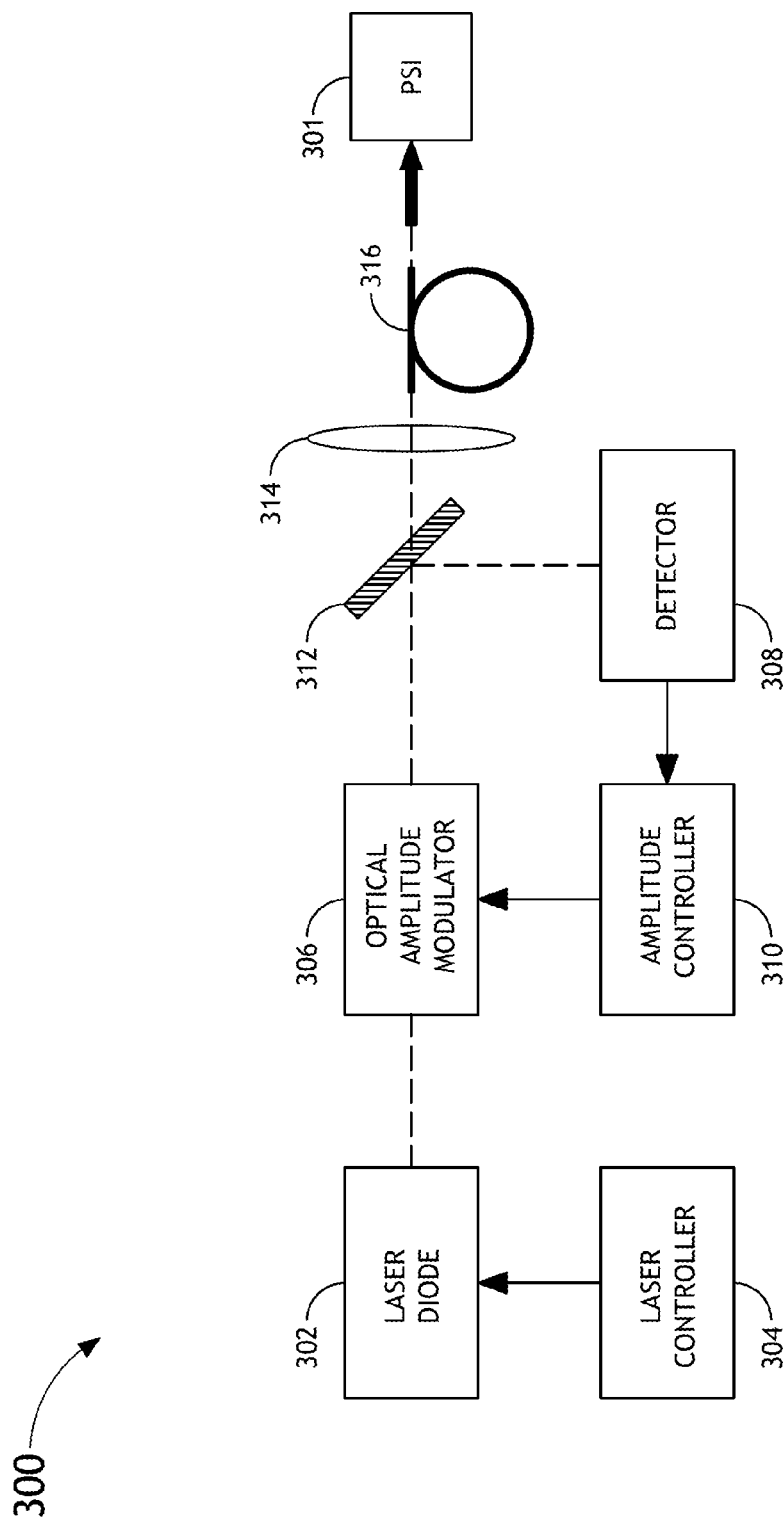
FIG. 3B is a block diagram illustrating a system for stabilizing optical power of illumination provided by a wavelength-tunable laser for a phase-shifting interferometry system, in accordance with one embodiment of the present invention.
Figure 3C:
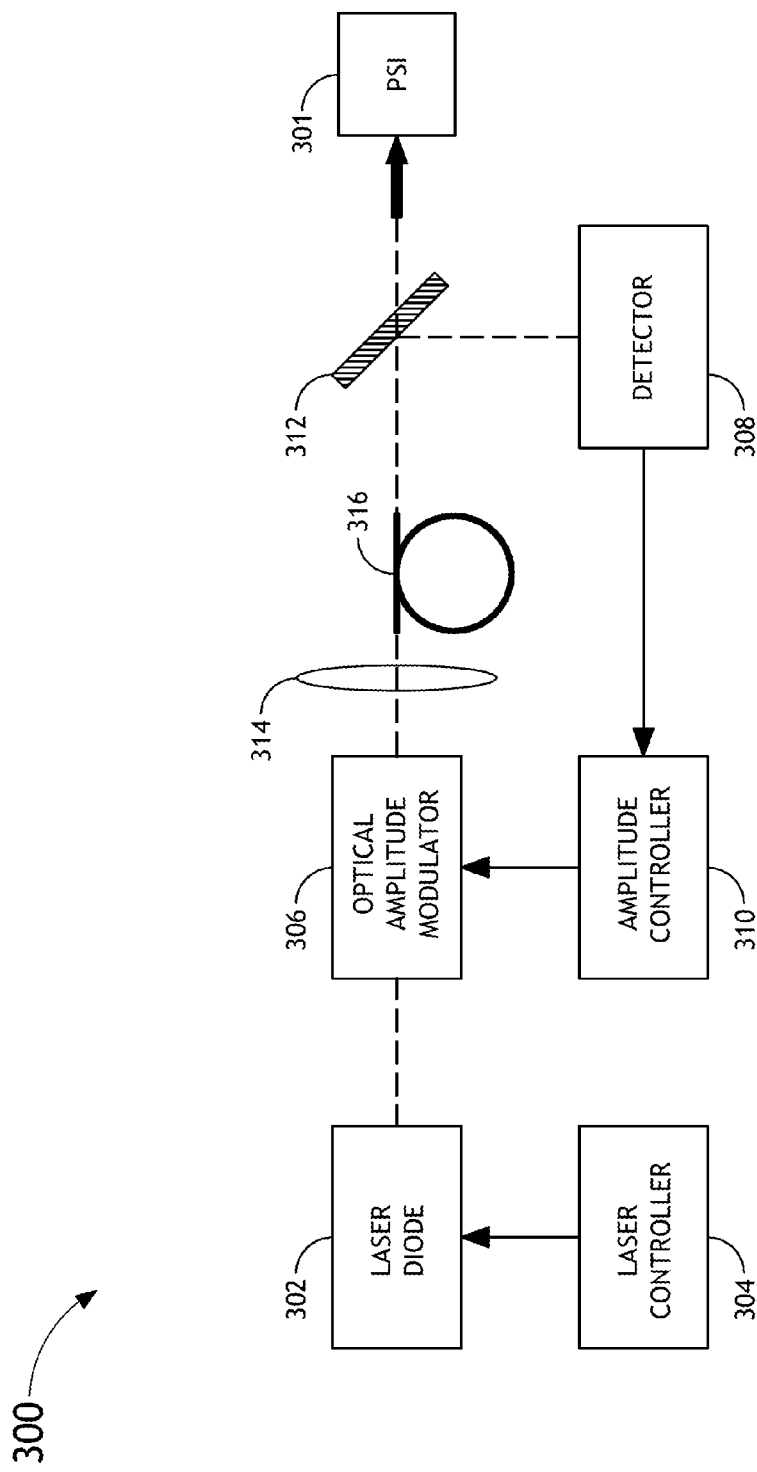
FIG. 3C is a block diagram illustrating a system for stabilizing optical power of illumination provided by a wavelength-tunable laser for a phase-shifting interferometry system, in accordance with one embodiment of the present invention.
Figure 3D:
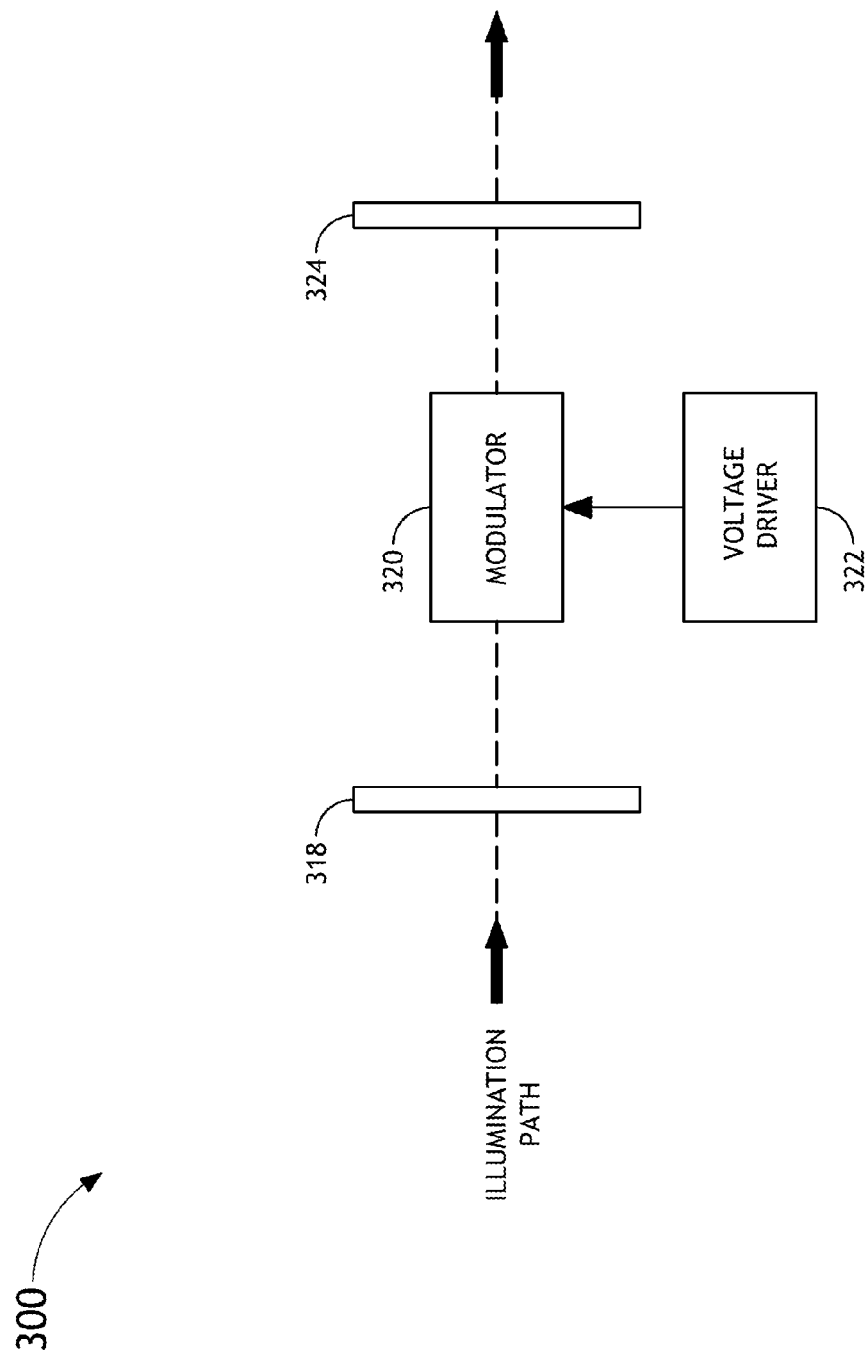
FIG. 3D is a block diagram illustrating an electro-optical amplitude modulator for adjusting optical power of illumination along an illumination path, in accordance with one embodiment of the present invention.

FIG. 3D illustrates one embodiment of the optical amplitude modulator 306 as an electro-optical amplitude modulator configured to adjust optical power of illumination received from the first portion of the illumination path and further configured to transmit illumination having adjusted optical power along the second portion of the illumination path. The optical amplitude modulator 306 may include an input polarizer 318 configured to receive illumination from the first portion of the illumination path. The input polarizer 318 may be further configured to pass a portion of illumination having a certain polarization while filtering out all other illumination.

The optical amplitude modulator 306 may further include a modulator 320 configured to receive the portion of illumination passed by the input polarizer 318. The modulator 320 may be further configured to control polarization of the portion of illumination. The modulator 320 may include a crystal configured to control polarization of the portion of illumination in response to voltage being applied to the crystal. The crystal may include an electro-optic crystal, such as a Lithium Niobate (LiNbO3) crystal. However, several crystals for controlling polarization of illumination are known to the art. Accordingly, the above example is included by way of example only and is not intended to limit the present invention in any way.

The optical amplitude modulator 306 may further include a voltage driver 322 configured to apply a selected voltage to the modulator 320. The voltage driver 322 may be further configured to supply the crystal of the modulator 320 with a selected voltage. The selected voltage may include a user selected voltage, a calculated voltage, or any voltage known to the art to provide illumination passing through the crystal a desired polarization.

The optical amplitude modulator 306 may further include an output polarizer 324 configured to receive polarized illumination from the modulator 320. The output polarizer 324 may be further configured to pass a portion of illumination having a certain polarization while filtering out all other illumination. Accordingly, optical power of illumination passing through the input polarizer 318, the modulator 320, and the output polarizer 324 may be attenuated in response to filtering by the polarizers 318 and 324 and change in polarization caused by the modulator 320. The output polarizer 324 may be further configured to transmit illumination having adjusted optical power along the second portion of the illumination path.

Referring to FIGS. 3B and 3C, in one embodiment the system 300 may further include an output coupler 314 configured to deliver illumination to the phase-shifting interferometer 301. The output coupler 314 may include a free space delivery system configured to deliver illumination along an optical path delineated in free space. Alternatively, the output coupler 314 may include an optical waveguide delivery system configured to deliver illumination along an optical path delineated by one or more optical elements (e.g. an optical fiber). As shown in FIG. 3B, the output coupler 314 may be disposed along the delivery path after the beam sampler 312. In another embodiment shown in FIG. 3C, the output coupler 314 may be disposed along the illumination path before the beam sampler 312.

In one embodiment, the system 300 may further include an optical fiber 316 configured to deliver illumination to the phase-shifting interferometer 301. The optical fiber 316 may be configured to delineate at least a portion of the optical path along which illumination is delivered by the output coupler 314 to the phase-shifting interferometer 301. As shown if FIG. 3B, the optical fiber 316 may be disposed along the delivery path after the beam sampler 312. In another embodiment shown in FIG. 3C, the optical fiber 316 may be disposed along the illumination path before the beam sampler.

The foregoing examples of various components of the system 300 are illustrative only. It is contemplated that various components may be included, excluded, or alternately configured without departing from the essence of the present invention. Accordingly, it should be understood that the foregoing explanations of various components and configurations of the system 300 only illustrate some of the contemplated embodiments of the system 300 and are not intended to limit the present invention in any way.

Figure 4:
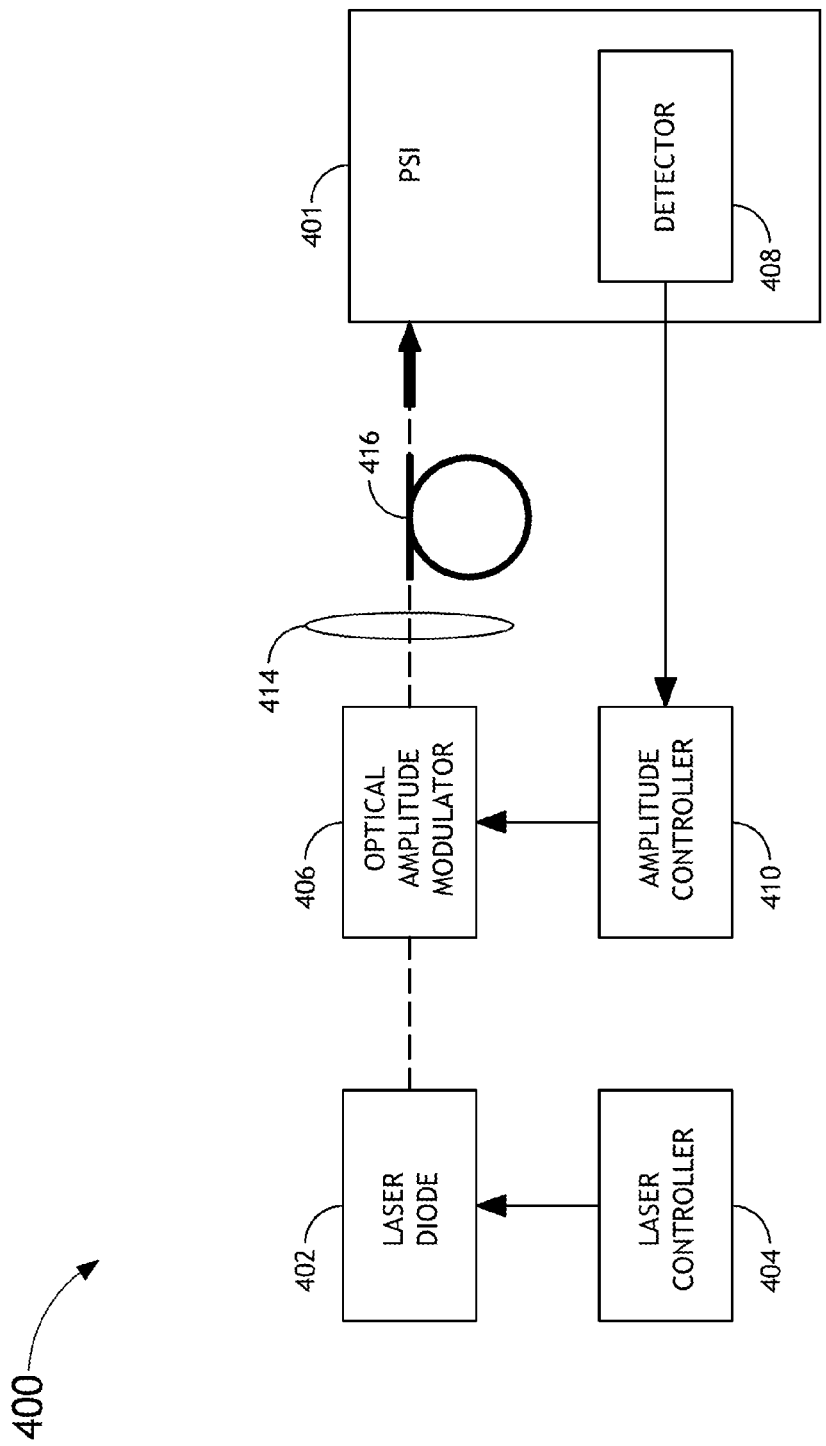
FIG. 4 is a block diagram illustrating a system for stabilizing optical power of illumination provided by a wavelength-tunable laser for a phase-shifting interferometry system, in accordance with one embodiment of the present invention.

FIG. 4 illustrates another embodiment of a system 400 configured to stabilize optical power of illumination provided by a wavelength-tunable laser for a phase-shifting interferometry system. Unless otherwise noted herein, the elements, components, configurations and/or functionality of system 400 should be understood to encompass all previously described embodiments of system 300 in addition to the alternative embodiments of system 400 described herein.

The system 400 may include a laser diode 402 configured to provide illumination at a plurality of selectable wavelengths along an illumination path. The system 400 may further include a laser controller 404 communicatively coupled to the laser diode 402. The laser controller 404 may be configured to control the laser diode 402. The system 400 may further include a phase-shifting interferometer 401 configured to receive at least a portion of illumination from the illumination path.

In one embodiment, the phase-shifting interferometer 401 may include at least one detector 408 configured to receive at least a portion of illumination received by the phase-shifting interferometer 401. For example, the detector 408 may receive a portion of illumination having been transmitted through an optical path delineated by components of the phase-shifting interferometer 401, as illustrated in FIG. 1 by the one or more detectors 136 and 156 of system 100 previously discussed.

The system 400 may further include an amplitude controller 410 communicatively coupled to the detector 408 of the phase-shifting interferometer 401. The amplitude controller 410 may be configured to receive information associated with optical power of the portion of illumination received by the detector 408. The amplitude controller 410 may be further configured to make a comparison of optical power of the portion of illumination received by the detector 408 and the selected optical power.

The system 400 may further include an optical amplitude modulator 406 communicatively coupled to the amplitude controller 410. The optical amplitude modulator 406 may be configured to stabilize optical power of illumination being delivered to the phase-shifting interferometer 401 by adjusting optical power of illumination being directed along the illumination path. The optical amplitude modulator 406 may be disposed along the illumination path and configured to receive at least a portion of illumination emanating from the laser diode 402 from a first portion of the illumination path. The optical amplitude modulator 406 may be further configured to adjust optical power of the received illumination and to transmit illumination having adjusted optical power along a second portion of the illumination path to the beam sampler 412.

The optical amplitude modulator 406 may be configured to adjust optical power of illumination received from the first portion of the illumination path in response to information received from the amplitude controller 410. For example, the optical amplitude modulator 406 may be configured to adjust optical power of illumination received from the first portion of the illumination path utilizing information associated with the comparison of optical power of the portion of illumination received by the detector 408 of the phase-shifting interferometer 401 and the selected optical power.

In one embodiment the system 400 may further include an output coupler 414 configured to deliver at least a portion of illumination from the illumination path to the phase-shifting interferometer 401. The output coupler may be disposed along the illumination path in between the optical amplitude modulator 406 and the phase-shifting interferometer 401. The system 400 may further include an optical fiber 416 disposed along the illumination path. The optical fiber 416 may delineate an optical path along which the output coupler 414 may be configured to direct the portion of illumination from the illumination path to the phase-shifting interferometer.

Figure 5:
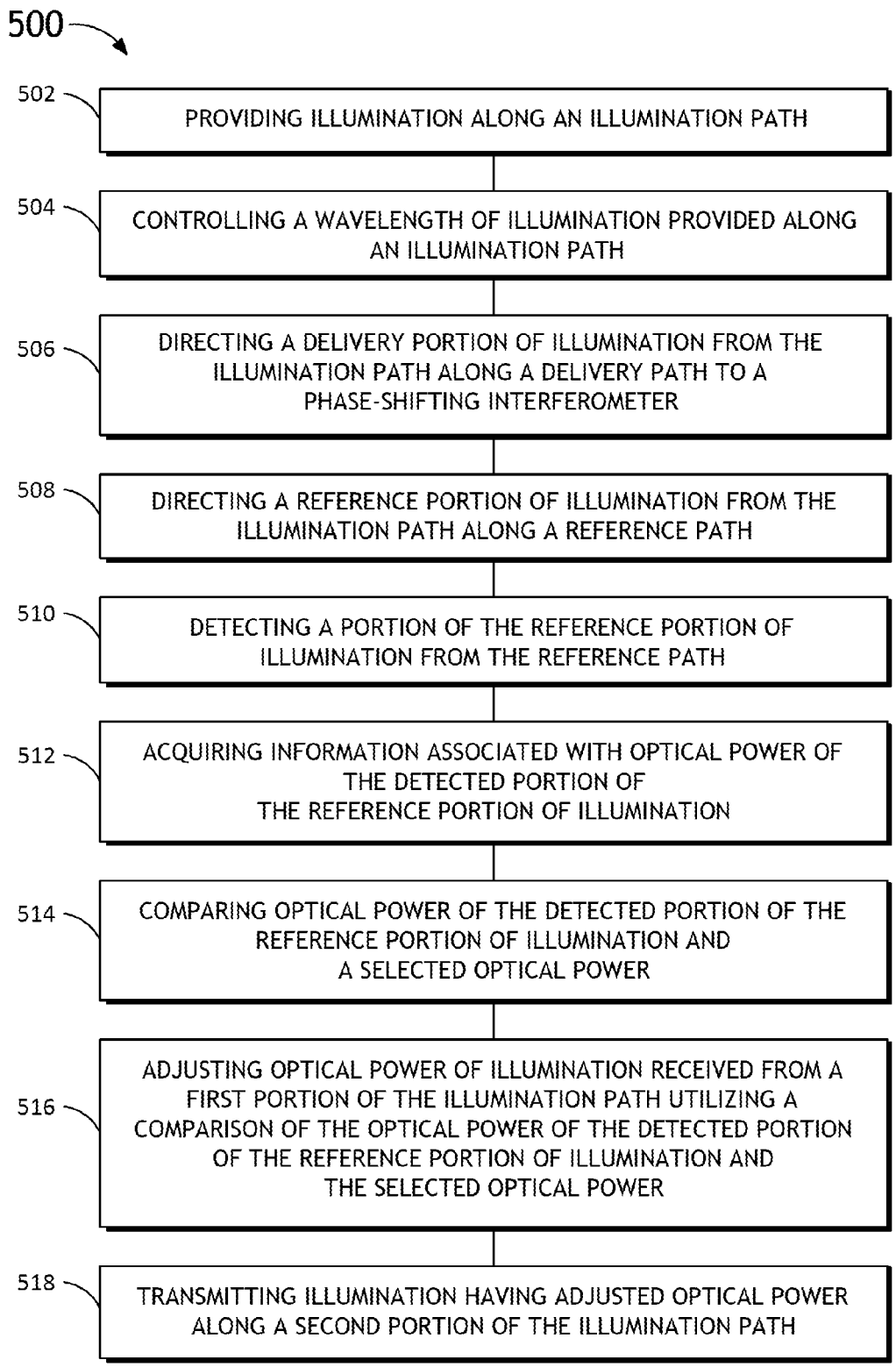
FIG. 5 is a flow diagram illustrating a method for stabilizing optical power of illumination provided by a wavelength-tunable laser for a phase-shifting interferometry system, in accordance with one embodiment of the present invention.

In accordance with the systems 100, 300, and 400 previously discussed herein, FIG. 5 is a flow chart illustrating one embodiment of a method 500 for stabilizing optical power of illumination provided by a wavelength-tunable laser for a phase-shifting interferometry system. Applicant notes that while the methods described throughout the remainder of the present disclosure are described in light of the systems 100, 300, and 400 described previously herein, the following methods are not limited to these systems. It is anticipated that other structural arrangements may be implemented to carry out the methods described herein.

The method 500 may include a step 502 of providing illumination along an illumination path. In step 502, illumination may be provided along an illumination path utilizing a laser diode configured to provide illumination at a plurality of wavelengths.

The method 500 may further include a step 504 of controlling a wavelength of illumination provided along an illumination path. For example, the wavelength of illumination emanating from the laser diode may be controlled utilizing a laser controller The method 500 may further include a step 506 of directing a delivery portion of illumination from the illumination path along a delivery path to a phase-shifting interferometer. For example, the delivery portion of illumination may be directed along the delivery path from the illumination path by a beam sampler. Alternatively, the delivery portion of illumination may come directly from the illumination path, such that the delivery path is a portion of the illumination path.

The method 500 may further include a step 508 of directing a reference portion of illumination from the illumination path along a reference path. For example, the reference portion of illumination may be directed along the reference path from the illumination path by a beam sampler. Alternatively, the reference portion of illumination may come directly from the illumination path, such that the reference path is a portion of the illumination path.

The method 500 may further include a step 510 of detecting at least a portion of the reference portion of illumination from the reference path. For example, the portion of the reference portion of illumination may be detected utilizing a detector such as a CCD camera, a CMOS camera, or any other photodetector.

The method 500 may further include a step 512 of acquiring information associated with optical power of the detected portion of the reference portion of illumination. For example, information may be acquired utilizing an amplitude controller communicatively coupled to the detector and configured to receive electronic signals from the detector. The acquired information may be associated with the light intensity detected by the detector. The acquired information may also be associated with other portions of illumination such as the illumination emanating from the laser diode, the illumination being delivered to the phase-shifting interferometer, and the like.

The method 500 may further include a step 514 of comparing optical power of the detected portion of the reference portion of illumination and a selected optical power. For example, optical power of the reference portion of illumination may be compared against the selected optical power utilizing an amplitude controller to compute a differential between optical power of the detected portion of the reference portion of illumination and the selected optical power.

The method 500 may further include a step 516 of adjusting optical power of illumination received from a first portion of the illumination path utilizing information associated with a comparison of optical power of the detected portion of the reference portion of illumination and the selected optical power. For example, illumination may be received from the first portion of the illumination path by an optical amplitude modulator. The optical amplitude modulator may adjust optical power of the received illumination in response to information received from the amplitude controller regarding the comparison of optical power of the detected portion of the reference portion of illumination and the selected optical power.

The method 500 may further include a step 518 of transmitting illumination having adjusted optical power along a second portion of the illumination path. For example, illumination having adjusted optical power may be transmitted along a second portion of the illumination path by an optical amplitude modulator after the optical amplitude modulator receives illumination from a first portion of the illumination path and adjusts optical power of received illumination in response to information associated with a comparison of optical power of the reference portion of illumination and the selected optical power.

While exemplary implementations of method 500 are discussed herein, it is further contemplated that various steps of method 500 may be included, excluded, rearranged, and/or implemented in many ways without departing from the essence of the present invention. Accordingly, the foregoing embodiments and implementations of method 500 are included by way of example only and are not intended to limit the present invention in any way.

Figure 6:
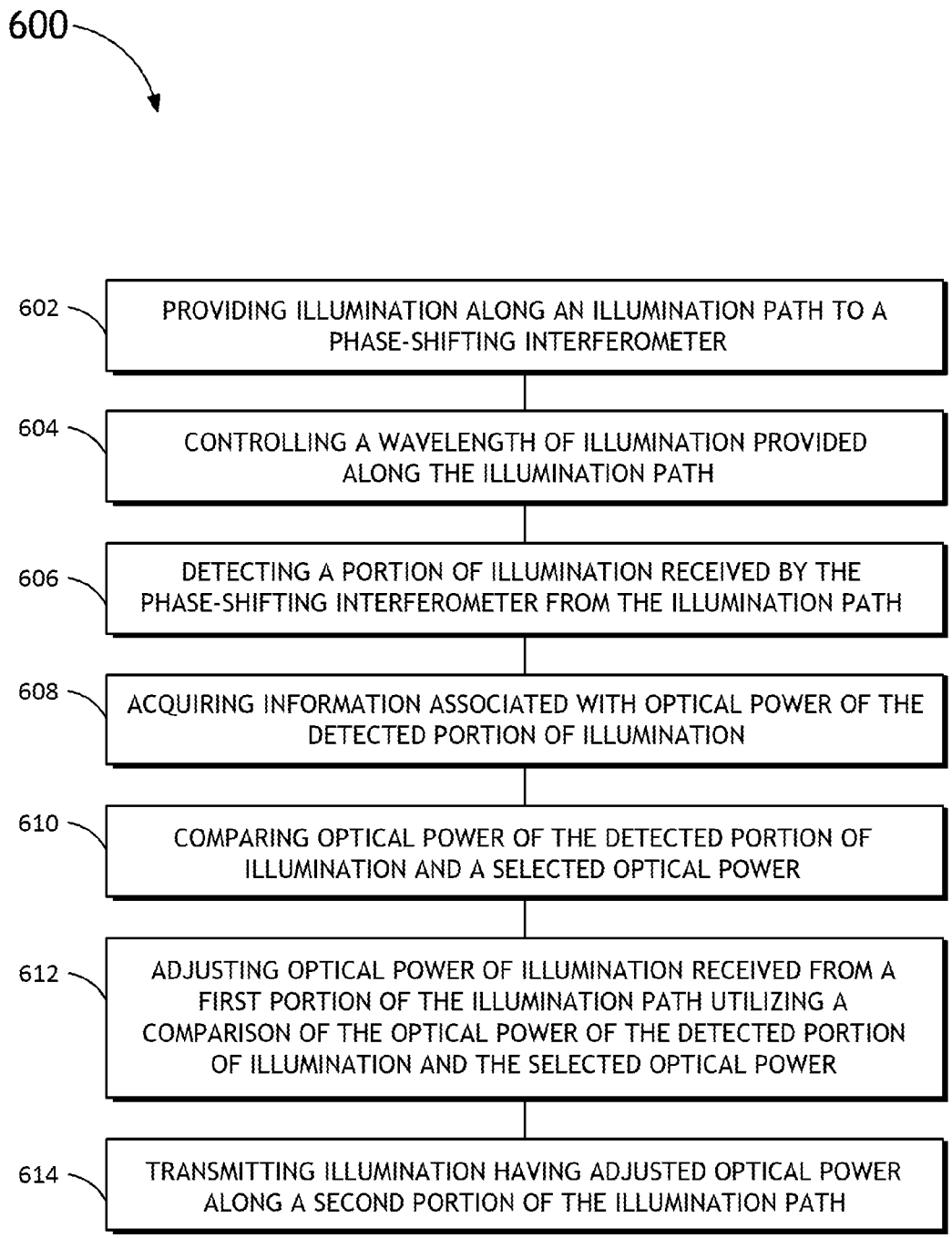
FIG. 6 is a flow diagram illustrating a method for stabilizing optical power of illumination provided by a wavelength-tunable laser for a phase-shifting interferometry system, in accordance with one embodiment of the present invention.

FIG. 6 is a flow chart illustrating an alternative embodiment of a method 600 for stabilizing optical power of illumination provided by a wavelength-tunable laser for a phase-shifting interferometry system. Unless otherwise noted herein, all steps or elements previously discussed in association with method 500 and any other system or method of the present disclosure are extended to the steps and elements of method 600.

The method 600 may include a step 602 of providing illumination along an illumination path to a phase-shifting interferometer. In step 502, illumination may be provided along an illumination path utilizing a laser diode configured to provide illumination at a plurality of wavelengths.

The method 600 may further include a step 604 of controlling a wavelength of illumination provided along an illumination path. For example, the wavelength of illumination emanating from the laser diode may be controlled utilizing a laser controller.

The method 600 may further include a step 606 of detecting at least a portion of illumination received by the phase-shifting interferometer from the illumination path. For example, the illumination received by the phase-shifting interferometer may be detected utilizing a detector of the phase-shifting interferometer, such as a CCD camera, a CMOS camera, or any other photodetector.

The method 600 may further include a step 608 of acquiring information associated with optical power of the detected portion of illumination. For example, information may be acquired utilizing an amplitude controller communicatively coupled to the detector and configured to receive electronic signals from the detector. In one embodiment wherein the detector may include a camera, the acquired information may be associated with light intensities of a plurality of pixels detected by the detector. The plurality of pixels may be associated with optical power of illumination received by the detector. Accordingly, information received by the amplitude controller relating to the plurality of pixels detected by the detector may be associated with optical power of illumination received by the detector. The acquired information may also be associated with other portions of illumination such as the illumination emanating from the laser diode, the illumination being delivered to the phase-shifting interferometer, and the like.

The method 600 may further include a step 610 of comparing optical power of the detected portion of illumination and a selected optical power. For example, optical power of the detected portion of illumination may be compared against the selected optical power utilizing an amplitude controller to compute a differential between optical power of the detected portion of illumination and the selected optical power.

The method 600 may further include a step 612 of adjusting optical power of illumination received from a first portion of the illumination path utilizing information associated with a comparison of optical power of the detected portion of illumination and the selected optical power. For example, illumination may be received from the first portion of the illumination path by an optical amplitude modulator. The optical amplitude modulator may adjust optical power of the received illumination in response to information received from the amplitude controller regarding the comparison of optical power of the detected portion of illumination and the selected optical power.

The method 600 may further include a step 614 of transmitting illumination having adjusted optical power along a second portion of the illumination path. For example, illumination having adjusted optical power may be transmitted along a second portion of the illumination path by an optical amplitude modulator after the optical amplitude modulator receives illumination from a first portion of the illumination path and adjusts optical power of received illumination in response to information associated with a comparison of optical power of the detected portion of illumination and the selected optical power.

While exemplary implementations of method 600 are discussed herein, it is further contemplated that various steps of method 600 may be included, excluded, rearranged, and/or implemented in many ways without departing from the essence of the present invention. Accordingly, the foregoing embodiments and implementations of method 600 are included by way of example only and are not intended to limit the present invention in any way.

It should be recognized that the various steps described throughout the present disclosure may be carried out by a single computing system or, alternatively, a multiple computing system. Moreover, different subsystems of the system may include a computing system suitable for carrying out at least a portion of the steps described above. Therefore, the above description should not be interpreted as a limitation on the present invention but merely an illustration. Further, the one or more computing systems may be configured to perform any other step(s) of any of the method embodiments described herein.

The computing system may include, but is not limited to, a personal computing system, mainframe computing system, workstation, image computer, parallel processor, or any other device known in the art. In general, the term "computing system" may be broadly defined to encompass any device having one or more processors, which execute instructions from a memory medium.

Program instructions implementing methods such as those described herein may be transmitted over or stored on carrier medium. The carrier medium may be a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed:

1. A system for stabilizing optical power of illumination provided by a wavelength-tunable laser, comprising:
   a laser diode, the laser diode configured to provide illumination along an illumination path;
   a laser controller communicatively coupled to the laser diode, the laser controller configured to adjust a wavelength of illumination emanating from the laser diode;
   a beam sampler, the beam sampler configured to receive illumination from the illumination path, the beam sampler further configured to direct a delivery portion of illumination received from the illumination path along a delivery path to a phase-shifting interferometer, the beam sampler further configured to direct a reference portion of illumination received from the illumination path along a reference path;
   a detector, the detector configured to receive a portion of the reference portion of illumination from the reference path;
   an amplitude controller communicatively coupled to the detector, the amplitude controller configured to receive information associated with optical power of the reference portion of illumination from the detector, the amplitude controller further configured to compare optical power of the reference portion of illumination and a selected optical power; and
   an optical amplitude modulator communicatively coupled to the amplitude controller, the optical amplitude modulator disposed along the illumination path, the optical amplitude modulator configured to adjust optical power of illumination received from a first portion of the illumination path utilizing information received from the amplitude controller associated with a comparison of the optical power of the reference portion of illumination and the selected optical power, the optical amplitude modulator further configured to transmit illumination having adjusted optical power along a second portion of the illumination path.

2. The system of claim 1, wherein the laser controller is configured to control voltage supplied to a piezoelectric transducer of the laser diode to adjust the wavelength of illumination emanating from the laser diode.

3. The system of claim 1, wherein the illumination path includes an optical fiber.

4. The system of claim 1, wherein the illumination path includes an output coupler.

5. The system of claim 1, wherein the delivery path includes an optical fiber.

6. The system of claim 1, wherein the delivery path includes an output coupler.

7. The system of claim 1, wherein the optical amplitude modulator comprises an electro-optical amplitude modulator.

8. The system of claim 7, wherein the optical amplitude modulator comprises an electro-optical amplitude modulator, comprising:
- an input polarizer, the input polarizer configured to receive illumination from the first portion of the illumination path;
- a modulator, the modulator configured to receive a portion of illumination from the input polarizer, the modulator having a crystal configured to control polarization of the portion of illumination in response to voltage applied to the crystal;
- a voltage driver, the voltage driver configured to apply a selected voltage to the crystal; and
- an output polarizer, the output polarizer configured to receive the portion of illumination from the modulator, the output polarizer further configured to transmit illumination having adjusted optical power along the second portion of the illumination path.

9. The system of claim 8, wherein the crystal comprises an electro-optic crystal.

10. The system of claim 9, wherein the electro-optic crystal comprises a Lithium Niobate ($LiNbO_3$) crystal.

11. The system of claim 1, wherein the optical amplitude modulator comprises a variable optical attenuator.

12. The system of claim 1, wherein the optical amplitude modulator comprises a Pocket's cell.

13. The system of claim 1, wherein the optical amplitude modulator comprises an acoustic-optical modulator.

14. The system of claim 1, wherein the optical amplitude modulator comprises a variable absorbing material.

15. The system of claim 1, wherein the amplitude controller comprises one or more computing systems configured to calculate the differential between optical power of the reference portion of illumination and the selected optical power.

16. The system of claim 15, wherein the amplitude controller further comprises a proportional integral derivative (PID) controller configured to calculate the differential between optical power of the reference portion of illumination and the selected optical power.

17. A system for stabilizing optical power of illumination provided by a wavelength-tunable laser, comprising:
- a phase-shifting interferometer;
- a laser diode, the laser diode configured to provide illumination along an illumination path;
- a laser controller communicatively coupled to the laser diode, the laser controller configured to adjust a wavelength of illumination emanating from the laser diode;
- a beam sampler, the beam sampler configured to receive illumination from the illumination path, the beam sampler further configured to direct a delivery portion of illumination received from the illumination path along a delivery path to the phase-shifting interferometer, the beam sampler further configured to direct a reference portion of illumination received from the illumination path along a reference path;
- a detector, the detector configured to receive a portion of the reference portion of illumination from the reference path;
- an amplitude controller communicatively coupled to the detector, the amplitude controller configured to receive information associated with optical power of the reference portion of illumination from the detector, the amplitude controller further configured to compare optical power of the reference portion of illumination and a selected optical power; and
- an optical amplitude modulator communicatively coupled to the amplitude controller, the optical amplitude modulator disposed along the illumination path, the optical amplitude modulator configured to adjust optical power of illumination received from a first portion of the illumination path utilizing information received from the amplitude controller associated with a comparison of the optical power of the reference portion of illumination and the selected optical power, the optical amplitude modulator further configured to transmit illumination having adjusted optical power along a second portion of the illumination path.

18. A system for stabilizing optical power of illumination provided by a wavelength-tunable laser, comprising:
- a laser diode, the laser diode configured to provide illumination along an illumination path;
- a laser controller communicatively coupled to the laser diode, the laser controller configured to adjust a wavelength of illumination emanating from the laser diode;
- a phase-shifting interferometer, the phase-shifting interferometer configured to receive illumination from the illumination path, the phase-shifting interferometer including a detector, the detector configured to receive a portion of illumination received by the phase-shifting interferometer from the illumination path;
- an amplitude controller communicatively coupled to the detector, the amplitude controller configured to receive information associated with optical power of the portion of illumination from the detector, the amplitude controller further configured to compare optical power of the portion of illumination received by the detector and a selected optical power; and
- an optical amplitude modulator communicatively coupled to the amplitude controller, the optical amplitude modulator disposed along the illumination path, the optical amplitude modulator configured to adjust optical power of illumination received from a first portion of the illumination path utilizing information received from the amplitude controller associated with a comparison of the optical power of the portion of illumination received by the detector and a selected optical power, the optical amplitude modulator further configured to transmit illumination having adjusted optical power along a second portion of the illumination path.

19. The system of claim 18, wherein the laser controller is configured to control voltage supplied to a piezoelectric transducer of the laser diode to adjust the wavelength of illumination emanating from the laser diode.

20. The system of claim 18, wherein the illumination path includes an optical fiber.

21. The system of claim 18, wherein the illumination path includes an output coupler.

22. The system of claim 18, wherein the optical amplitude modulator comprises an electro-optical amplitude modulator, comprising:
- an input polarizer, the input polarizer configured to receive illumination from the first portion of the illumination path;
- a modulator, the modulator configured to receive a portion of illumination from the input polarizer, the modulator having a crystal configured to control polarization of the portion of illumination in response to voltage applied to the crystal;
- a voltage driver, the voltage driver configured to apply a selected voltage to the crystal; and
- an output polarizer, the output polarizer configured to receive the portion of illumination from the modulator, the output polarizer further configured to transmit illumination having adjusted optical power along the second portion of the illumination path.

23. The system of claim 22, wherein the crystal comprises an electro-optic crystal.

24. The system of claim 23, wherein the electro-optic crystal comprises a Lithium Niobate (LiNbO$_3$) crystal.

25. The system of claim 18, wherein the optical amplitude modulator comprises a variable optical attenuator.

26. The system of claim 18, wherein the optical amplitude modulator comprises a Pocket's cell.

27. The system of claim 18, wherein the optical amplitude modulator comprises an acoustic-optical modulator.

28. The system of claim 18, wherein the optical amplitude modulator comprises a variable absorbing material.

29. The system of claim 18, wherein the amplitude controller comprises one or more computing systems configured to calculate the differential between optical power of the reference portion of illumination and the selected optical power.

30. The system of claim 29, wherein the amplitude controller comprises a proportional integral derivative (PID) controller configured to calculate the differential between optical power of the reference portion of illumination and the selected optical power.

31. The system of claim 18, wherein the detector comprises a camera.

32. The system of claim 31, wherein the amplitude controller is configured to receive information associated with light intensities of a plurality of pixels from the camera, wherein the plurality of pixels are associated with optical power of illumination received by the camera.

33. A method for stabilizing optical power of illumination provided by a wavelength-tunable laser, comprising:
  generating illumination along an illumination path;
  controlling a wavelength of illumination provided along the illumination path;
  directing a delivery portion of illumination from the illumination path along a delivery path to a phase-shifting interferometer;
  directing a reference portion of illumination from the illumination path along a reference path;
  detecting a portion of the reference portion of illumination from the reference path;
  acquiring information associated with optical power of the detected portion of the reference portion of illumination;
  comparing optical power of the detected portion of the reference portion of illumination and a selected optical power;
  adjusting optical power of illumination received from a first portion of the illumination path utilizing information associated with a comparison of the optical power of the detected portion of the reference portion of illumination and the selected optical power; and
  transmitting illumination having adjusted optical power along a second portion of the illumination path.

34. A method for stabilizing optical power of illumination provided by a wavelength-tunable laser, comprising:
  generating illumination along an illumination path to a phase-shifting interferometer;
  controlling a wavelength of illumination provided along the illumination path;
  detecting a portion of illumination received by the phase-shifting interferometer from the illumination path;
  acquiring information associated with optical power of the detected portion of illumination;
  comparing optical power of the detected portion of illumination and a selected optical power;
  adjusting optical power of illumination received from a first portion of the illumination path utilizing information associated with a comparison of the optical power of the detected portion of illumination and the selected optical power; and
  transmitting illumination having adjusted optical power along a second portion of the illumination path.

35. The method of claim 34, wherein the acquiring information associated with optical power of the detected portion of illumination comprises:
  acquiring information associated with light intensities of a plurality of pixels from a detector, wherein the plurality of pixels are associated with optical power of illumination received by the detector.

* * * * *